United States Patent
Garcia Granda et al.

(10) Patent No.: US 11,385,554 B2
(45) Date of Patent: Jul. 12, 2022

(54) METROLOGY APPARATUS AND METHOD FOR DETERMINING A CHARACTERISTIC RELATING TO ONE OR MORE STRUCTURES ON A SUBSTRATE

(71) Applicant: ASML Netherlands B.V., Veldhoven (NL)

(72) Inventors: Miguel Garcia Granda, Veldhoven (NL); Steven Erik Steen, Veldhoven (NL); Eric Jos Anton Brouwer, Weert (NL); Bart Peter Bert Segers, Tessenderlo (BE); Pierre-Yves Jerome Yvan Guittet, Veldhoven (NL); Frank Staals, Eindhoven (NL); Paulus Jacobus Maria Van Adrichem, Wijchen (NL)

(73) Assignee: ASML Netherlands B.V., Veldhoven (NL)

( * ) Notice: Subject to any disclaimer, the term of this patent is extended or adjusted under 35 U.S.C. 154(b) by 426 days.

(21) Appl. No.: 16/456,878

(22) Filed: Jun. 28, 2019

(65) Prior Publication Data

US 2020/0026182 A1    Jan. 23, 2020

(30) Foreign Application Priority Data

Jul. 18, 2018  (EP) .................................... 18184163

(51) Int. Cl.
*G03F 7/20* (2006.01)
*G03F 1/44* (2012.01)
*G03F 1/84* (2012.01)

(52) U.S. Cl.
CPC ............ *G03F 7/70683* (2013.01); *G03F 1/44* (2013.01); *G03F 1/84* (2013.01); *G03F 7/70283* (2013.01);

(Continued)

(58) Field of Classification Search
CPC .......... G03F 1/44; G03F 1/84; G03F 7/70283; G03F 7/70625; G03F 7/70641;

(Continued)

(56) References Cited

U.S. PATENT DOCUMENTS

| 6,440,616 B1 | 8/2002 | Izuha et al. |
| 6,952,253 B2 | 10/2005 | Lof et al. |

(Continued)

FOREIGN PATENT DOCUMENTS

| EP | 1 628 164 A2 | 2/2006 |
| WO | WO 2013/189724 A2 | 12/2013 |
| WO | WO 2017/202665 A1 | 11/2017 |

OTHER PUBLICATIONS

International Search Report and Written Opinion of the International Searching Authority directed to related International Patent Application No. PCT/EP2019/066147, dated Aug. 8, 2019; 13 pages.

*Primary Examiner* — Christina A Riddle
(74) *Attorney, Agent, or Firm* — Sterne, Kessler, Goldstein & Fox P.L.L.C.

(57) ABSTRACT

Disclosed is a method of determining a characteristic of interest, in particular focus, relating to a structure on a substrate formed by a lithographic process, and an associated patterning device and lithographic system. The method comprises forming a modified substrate feature on the substrate using a corresponding modified reticle feature on a patterning device, the modified substrate feature being formed for a primary function other than metrology, more specifically for providing a support for a vertically integrated structure. The modified reticle feature is such that said modified substrate feature is formed with a geometry dependent on the characteristic of interest during formation. The modified substrate feature can be measured to determine said characteristic of interest.

20 Claims, 5 Drawing Sheets

(52) U.S. Cl.
CPC ...... *G03F 7/70616* (2013.01); *G03F 7/70625* (2013.01); *G03F 7/70641* (2013.01)

(58) Field of Classification Search
CPC .............. G03F 7/7055; G03F 7/70558; G03F 7/70616–70683; G03F 1/36; G03F 1/38; G03F 1/70; G03F 1/42; H01L 27/11582–11587; H01L 27/2481; H01L 23/544; H01L 2223/544–5442; H01L 2224/03005; H01L 2224/03015; H01L 2224/11015; H01L 2224/27015
USPC ..... 430/5, 22, 30; 355/30, 52–55, 67–71, 77
See application file for complete search history.

(56) References Cited

U.S. PATENT DOCUMENTS

| | | |
|---|---|---|
| 8,994,944 B2 | 3/2015 | Cramer et al. |
| 9,081,303 B2 | 7/2015 | Cramer et al. |
| 9,182,682 B2 | 11/2015 | Cramer et al. |
| 9,594,299 B2 | 3/2017 | Hinnen et al. |
| 2010/0328655 A1 | 12/2010 | Den Boef |
| 2011/0026032 A1 | 2/2011 | Den Boef et al. |
| 2011/0102753 A1 | 5/2011 | Van De Kerkhof et al. |
| 2011/0249244 A1 | 10/2011 | Leewis et al. |
| 2012/0044470 A1 | 2/2012 | Smilde et al. |
| 2013/0100143 A1 | 4/2013 | Pan et al. |
| 2014/0071415 A1 | 3/2014 | Brunner |
| 2015/0293458 A1* | 10/2015 | Vanoppen ........... G03F 7/70558 355/53 |
| 2015/0331336 A1* | 11/2015 | Quintanilha ........ G03F 7/70683 355/77 |
| 2015/0338749 A1* | 11/2015 | Hinnen ..................... G03F 1/44 355/55 |
| 2015/0340376 A1* | 11/2015 | Park .................. H01L 27/11582 257/329 |
| 2016/0313656 A1 | 10/2016 | Van Dommelen et al. |
| 2016/0363871 A1 | 12/2016 | Van Oosten et al. |

* cited by examiner

METROLOGY APPARATUS AND METHOD FOR DETERMINING A CHARACTERISTIC RELATING TO ONE OR MORE STRUCTURES ON A SUBSTRATE

FIELD

The present invention relates to a metrology apparatus or an inspection apparatus for determining a characteristic relating to formation of structures on a substrate. The present invention also relates to a method for determining said characteristic.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable to make frequently measurements of the structures created, e.g., for process control and verification. Various tools for making such measurements are known, including scanning electron microscopes or various forms of metrology apparatuses, such as scatterometers. A general term to refer to such tools may be metrology apparatuses or inspection apparatuses.

One important parameter of a lithographic process which requires monitoring is focus, and more specifically, the focus of the lithographic apparatus while printing the pattern on the substrate. There is a desire to integrate an ever-increasing number of electronic components in an IC. To realize this, it is necessary to decrease the size of the components and therefore to increase the resolution of the projection system, so that increasingly smaller details, or line widths, can be projected on a target portion of the substrate. As the critical dimension (CD) in lithography shrinks, consistency of focus, both across a substrate and between substrates, becomes increasingly important. CD is the dimension of a feature or features (such as the gate width of a transistor) for which variations will cause undesirable variation in physical properties of the feature. Traditionally, optimal settings were determined by "send-ahead wafers" i.e. substrates that are exposed, developed and measured in advance of a production run. In the send-ahead wafers, test structures are exposed in a so-called focus-energy matrix (FEM) and the best focus and energy settings are determined from examination of those test structures.

Another method of determining focus and/or dose has been through diffraction based focus techniques. Diffraction based focus may use target forming features on the reticle which print targets having a degree of asymmetry which is dependent on the focus and/or dose setting during printing. This degree of asymmetry can then be measured and the focus and/or dose inferred from the asymmetry measurement.

The focus targets for such methods tend to require location away from the actual device structures, for example in the scribe lane. There are a number of limitations with such an arrangement.

SUMMARY

It is an object to provide an effective an efficient solution for an inspection or metrology apparatus that solves one or more of the above discussed problems or limitations.

Embodiments of the invention are disclosed in the claims and in the detailed description.

In a first aspect of the invention there is provided a method of determining a characteristic of interest relating to a structure on a substrate formed by a lithographic process, the method comprising: measuring said modified substrate feature to determine said characteristic of interest, wherein the modified substrate feature being formed on the substrate using a corresponding modified reticle feature on a patterning device, said modified substrate feature being formed for a primary function other than metrology, the modified reticle feature being such that said modified substrate feature is formed with a geometry dependent on the characteristic of interest during formation.

In a second aspect of the invention there is provided a patterning device comprising a modified reticle feature for forming a modified substrate feature on a substrate with a geometry dependent on the characteristic of interest during its formation, and wherein said modified substrate feature has a primary function other than metrology.

In a third aspect of the invention there is provided a lithographic system for determining a characteristic of interest relating to at least one structure on a substrate formed by a lithographic process, the lithographic system comprising: the patterning device of the second or fifth aspect, for forming a subsequent modified substrate feature on a substrate; and a metrology device for performing the measurement step of the first aspect.

In a fourth aspect of the invention there is provided a method of determining a focus setting relating to formation of a structure on a substrate by a lithographic process in the manufacture of a vertically integrated structure, the method comprising: forming a substrate support feature, for providing a support structure for the vertically integrated structure, on the substrate using a corresponding reticle support feature, said reticle support feature being such that said substrate support feature is formed with a geometry dependent on the characteristic of interest during formation; and measuring said substrate support feature to determine said focus setting.

In a fifth aspect of the invention there is provided a patterning device for patterning a layer of a vertically integrated structure, comprising: a reticle support feature for forming a substrate support feature on a substrate with a geometry dependent on a focus setting during its formation, and wherein said substrate support feature is for providing a support structure for the vertically integrated structure.

Also disclosed is a non-transitory computer program product comprising machine-readable instructions for causing a processor to cause performance of the method of the first, fourth and fifth aspect.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
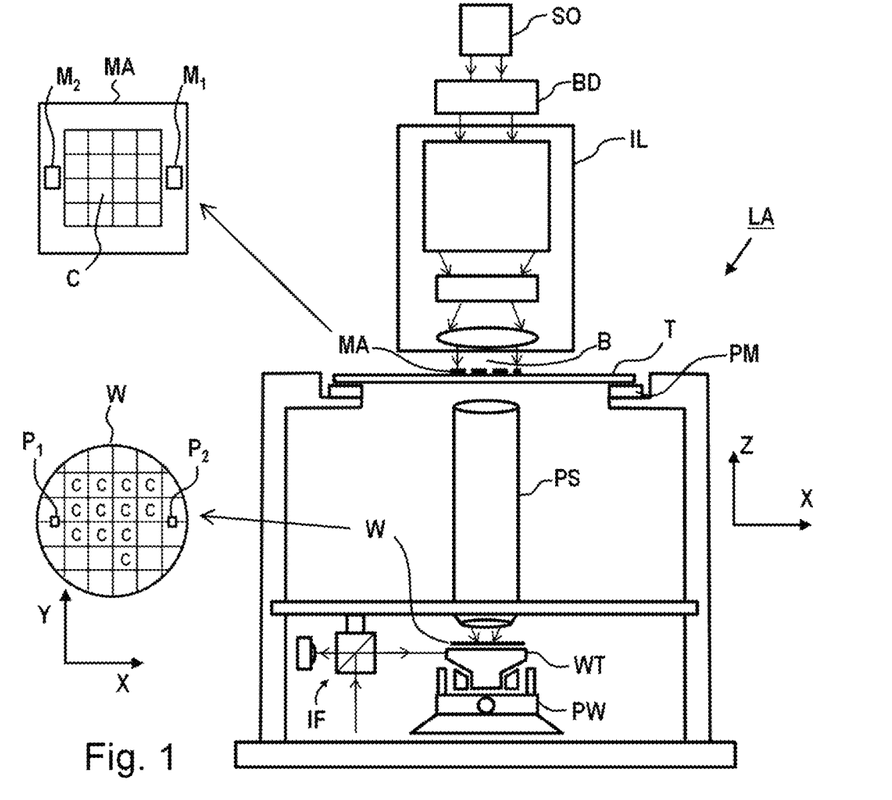
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
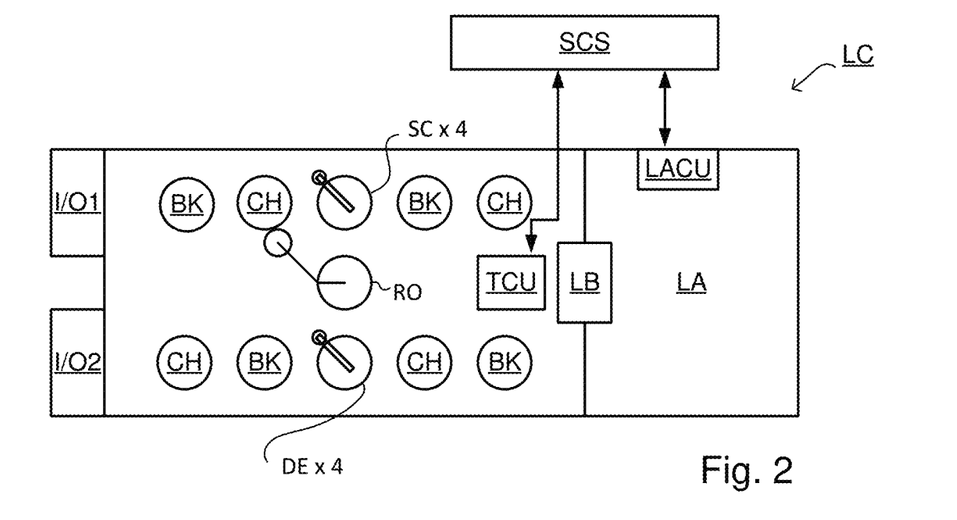
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer.

The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
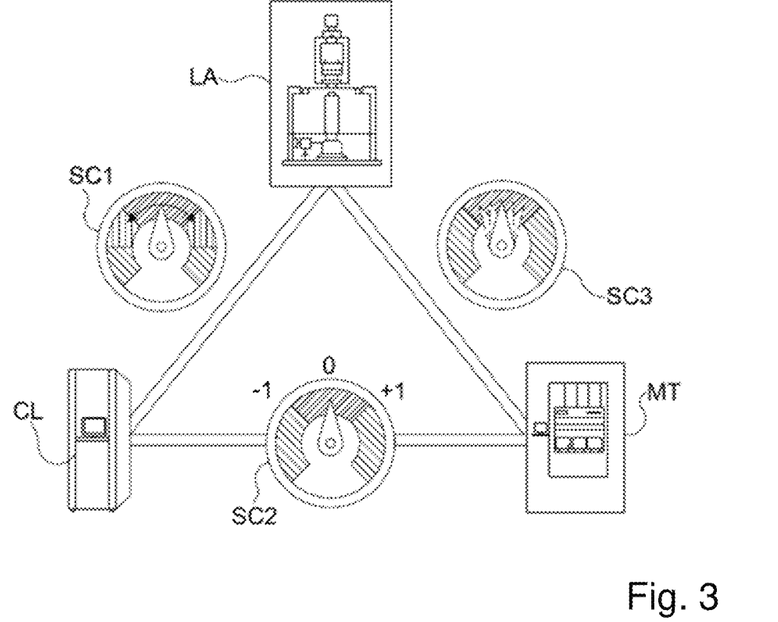
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating can be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers can measure in one image multiple targets from multiple gratings using light from soft x-ray and visible to near-IR wave range.

Figure 4:
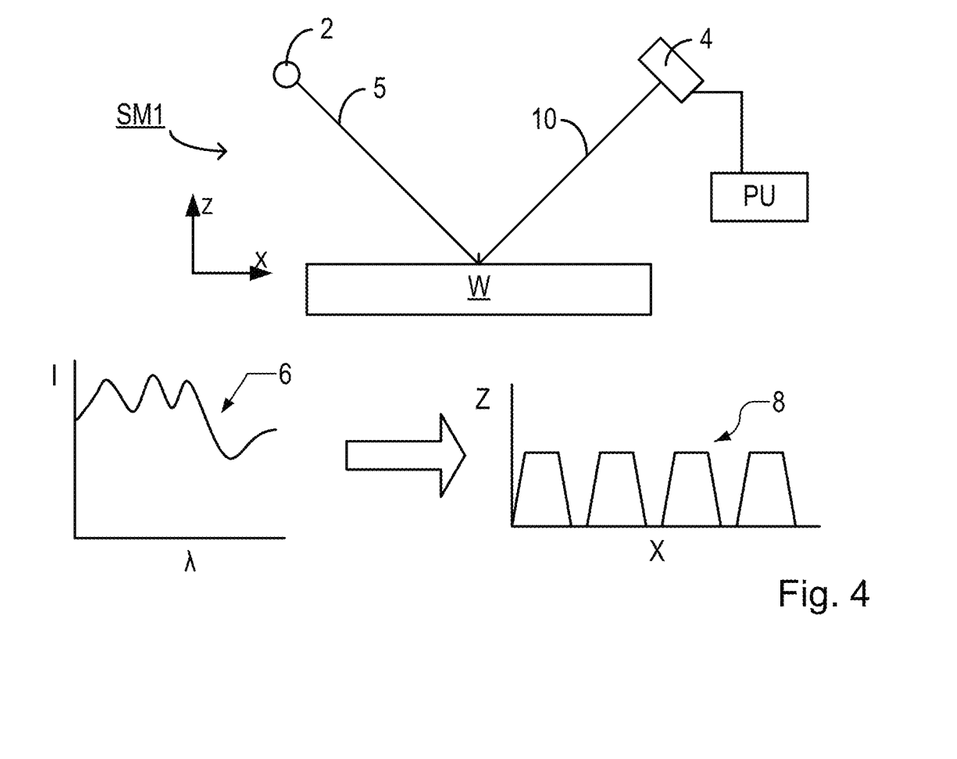
FIG. 4 illustrates an inspection apparatus according to an embodiment of the invention.

A metrology apparatus, such as a scatterometer, is depicted in FIG. 4. It comprises a broadband (white light) radiation projector 2 which projects radiation 5 onto a substrate W. The reflected or scattered radiation 10 is passed to a spectrometer detector 4, which measures a spectrum 6 (i.e. a measurement of intensity I as a function of wavelength k) of the specular reflected radiation 10. From this data, the structure or profile 8 giving rise to the detected spectrum may be reconstructed by processing unit PU, e.g. by Rigorous Coupled Wave Analysis and non-linear regression or by comparison with a library of simulated spectra. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 5A:
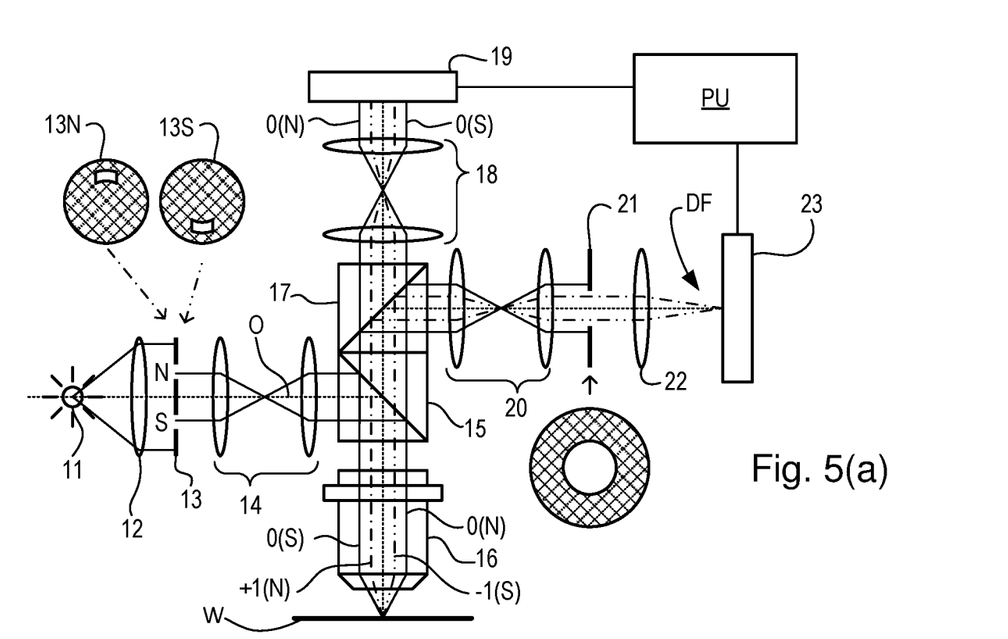
FIGS. 5(a)-5(d) comprises 5(a) a schematic diagram of a dark field scatterometer for use in measuring targets according to embodiments of the invention using a first pair of illumination apertures, 5(b) a detail of diffraction spectrum of a target grating for a given direction of illumination 5(c) a second pair of illumination apertures providing further illumination modes in using the scatterometer for diffraction based overlay measurements and 5(d) a third pair of illumination apertures combining the first and second pair of apertures.

An alternative metrology apparatus suitable for use in embodiments of the invention is shown in FIG. 5(a). A target T and diffracted rays of measurement radiation used to illuminate the target are illustrated in more detail in FIG. 5(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

Figure 5B:
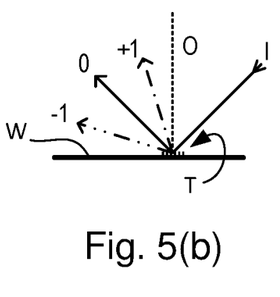

As shown in FIG. 5(b), target T is placed with substrate W normal to the optical axis O of objective lens 16. The substrate W may be supported by a support (not shown). A ray of measurement radiation I impinging on target T from an angle off the axis O gives rise to a zeroeth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 5(a) and 3(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 5(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled 1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroeth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroeth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 5 are purely examples. In another embodiment of the invention, on-axis illumination of the targets is used and an aperture stop with an off-axis aperture is used to pass substantially only one first order of diffracted light to the sensor. In yet other embodiments, 2nd, 3rd and higher order beams (not shown in FIG. 5) can be used in measurements, instead of or in addition to the first order beams.

Figure 5C:
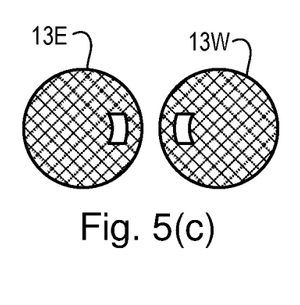
Figure 5D:
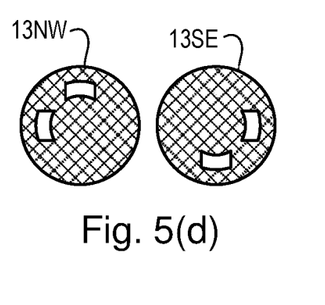

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 3(c) and (d). The use of these, and numerous other variations and applications of the apparatus are described in prior published applications, mentioned above.

When monitoring a lithographic process, it is desirable to monitor a lithographic process parameter such as focus of the lithography beam on the substrate. One known method of determining the focus setting from a printed structure is by measuring the critical dimension (CD) of the printed structure. CD is a measure of the smallest feature (e.g., line width of an element). The printed structure may be a target, such as a line-space grating, formed specifically for focus monitoring. It is known that CD usually displays 2nd order response to focus, forming what is known as a "Bossung curve" on a plot of CD (y-axis) against focus (x-axis). A Bossung curve is a substantially symmetrical curve which is substantially symmetrical around a peak representing the best focus. The Bossung curve may be substantially parabolic in shape. There are several drawbacks to this approach. One drawback is that the method shows low sensitivity near best focus (due to the parabolic shape of the curve). Another drawback is that the method is insensitive to the sign of any defocus (as the curve is largely symmetrical around best focus). Also this method is sensitive to inter alia dose and process variation (crosstalk).

To address these issues, diffraction based focus (DBF) was devised. Diffraction based focus may use target forming features on the reticle which print targets having a degree of asymmetry which is dependent on the focus setting during printing. This degree of asymmetry can then be measured using a scatterometery based inspection method, for example by measuring the intensity asymmetry between the intensities of +1st and −1st order radiation diffracted from the target, to obtain a measure of the focus setting.

To fabricate vertically integrated devices (e.g., memory devices), such as vertical NAND or 3D NAND, very thick (tall) multilayer stacks are fabricated onto a substrate. This is followed by a deep etch process to form contact holes through the stack. The height of these multilayer stacks may be, for example, greater than 10 μm in the direction perpendicular to the substrate surface. During deposition of these layers, inhomogeneities in the deposition rates and tensions of the coated layers generate topography profiles on the stack surface which can negatively impact the lithography of the following layers.

For this reason, focus control when forming certain layers is very important for such devices. In particular, the layer which defines the contact holes that will be etched through the whole multilayer structure is particularly focus sensitive. To control focus during the fabrication of these devices, a feedback correction method may be employed based on a measurements of structures performed on previously processed substrates. From these measurements, it is possible to infer the focus setting used in formation of the measured structures. For example, presently, one or more of the following methods may be used to determine focus:

Direct measurements on product wafers using diffraction based focus (DBF) technology based on measurements of metrology targets formed in the scribe lane. DBF technology uses focus targets which have a sole metrology function/purpose, by being designed to have a focus based asymmetry. By measuring the asymmetry of the target (e.g., by using a scatterometer), it is possible to determine the focus setting used in its formation. These techniques may also be referred to as micro-DBF (μDBF), particularly where dark-field techniques are used to measure smaller targets. Such techniques are described in: U.S. Pat. No. 9,182,682B2, U.S. Pat. No. 9,081,303B2, U.S. Pat. No. 8,994,944B2; and similar techniques are described in: U.S. Pat. No. 9,594,299B2, US20160313656A1, US20160363871A1. All of these documents are incorporated herein by reference.

Measurement of focus via CDSEM (critical dimension scanning electron microscopy) technology, based on measurement of specific marks (once again having have a sole metrology function/purpose) deposited on top of the device.

Indirect focus measurement via computational metrology techniques or other methods which computationally model the focus setting.

Measurements based on structures in the scribe lane often suffer from variable measurement offsets between the scribe lane structures and the device structures (e.g., a different relationship between focus and its effect on the formed structures). This can make the inferred focus values less reliable (e.g., not truly representative of the focus values of the device features) and therefore the any corrections based on these measurements will be compromised. However, measurements performed directly on structures (i.e., using CDSEM) in the device area require the formation of specific target structures which are typically incompatible with the product, and require a reticle different from than that used to form the product structures. This means that the substrates have to be re-worked afterwards to remove the layer comprising the focus marks. Additionally, CDSEM inspection is very slow.

It is therefore proposed to develop a method which enables DBF (or μDBF) technology to be applied on the device area of vertically integrated circuits (e.g., 3D NAND). Such a method may enable focus measurements to be performed in the device area using scatterometry; e.g., using a metrology device as illustrated in FIG. 4 or FIG. 5(a).

More specifically, it is proposed to form a modified substrate feature of the device, said modified substrate feature being formed for a primary function other than metrology, the modification being such that said modified substrate feature has a secondary metrology function, more specifically still for the measuring of focus. In an embodiment, the modified substrate feature may have no electrical function within the working device. A specific such implementation based on modification of support features will be described below. However, in alternative embodiments some features which do have some electrical function, such as those defining large contact pads or interconnects, may also be suitable for modification for a secondary metrology purpose within the scope of this disclosure.

The modification may be implemented via a modified reticle feature so as to introduce a measurable feature focus dependency. In an embodiment, the focus dependency may comprise a focus dependent asymmetry in the feature (e.g., a side wall angle (SWA) asymmetry), in a similar manner to DBF. After development of a layer of photoresist, the feature may be a hole in the layer of photoresist and at one or more specific side(s) of the hole the wall of photoresist that faces the interior of the hole may have the focus dependent asymmetry, e.g., the focus dependent side wall angle (SWA). This may be achieved by providing the modified reticle features with one or more specific assist features (e.g. sub-resolution sub-features) which impose a focus-dependent geometry (asymmetry) on the exposed feature.

In a main embodiment the modified substrate feature may be related to the formation of support structures, or support pillars used to support a vertically integrated circuit device. As such, it is proposed to form focus targets on the features for forming supporting pillars; wherein a focus target comprises a target having a focus dependency, more specifically a focus dependent asymmetry, which can be measured to determine or infer the focus value used during the target's formation.

To support the vertically integrated structure so that it remains stable when the nitride layers of the stack are etched away prior to a tungsten filling step, support structures, or support pillars, are typically provided. These support pillars are formed in the same manner as the cell array, i.e., by exposing, from a corresponding pattern on a reticle, a support feature or hole feature onto the substrate. These support features are then filled in subsequent processing steps (e.g, etch) to provide a structural support pillar. Because these pillars do not have any electrical function, there is a (limited) freedom to modify their shape without impacting the performance of the device. More specifically, there is a (limited) freedom to modify the 3d dimensional shape of the holes in a layer of photoresist material.

Figure 6:
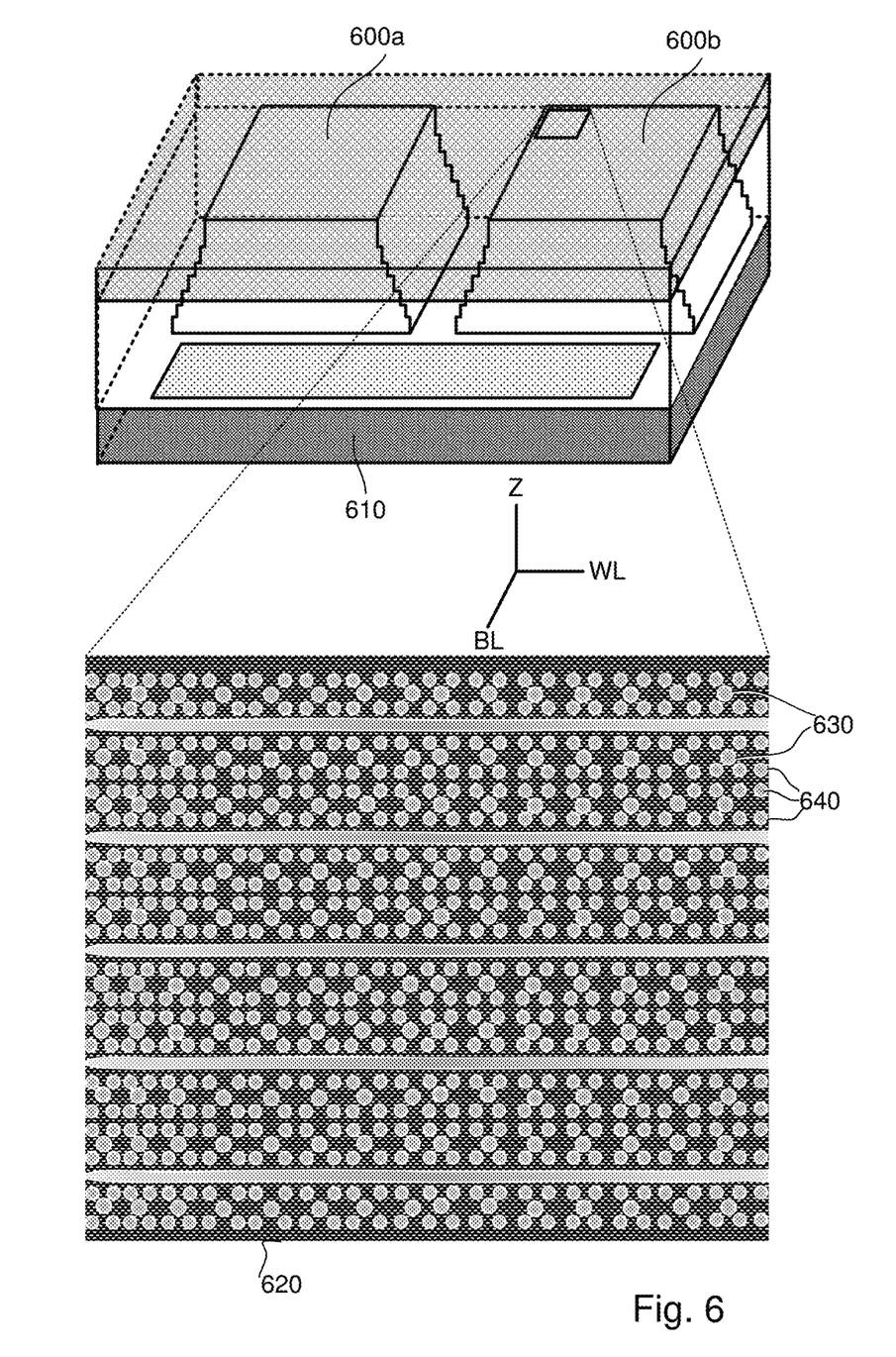
FIG. 6 is a schematic illustration of a vertically integrated memory device, and a detail thereof.

FIG. 6 shows (a) an oblique projection (directions shown are bitline direction BL, wordline direction WL and the Z direction, perpendicular to these); and (b) an overhead view of a pair of vertically integrated cell arrays 600a, 600b formed on a substrate 610. The cell arrays 600a, 600b are essentially frusto-pyramidal in shape with a stepped profile (staircase structure) at the sides. A top-down detail 620 of the top of one cell array 600b is shown. The cell arrays can be seen to comprise rows of memory holes 630 (the larger circular structures) and rows of features (holes) for support pillars 640 (the smaller circular structures). It is the support pillar features which may be modified according to an embodiment.

Figure 7A:
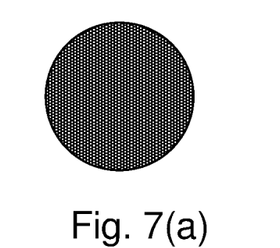
FIGS. 7(a)-7(g) illustrates 7(a) a conventional reticle feature for forming a support pillar; and 7(b)-7(g) a number of alternative proposals for modified reticle features which introduce focus dependency in accordance to an embodiment of the invention.

FIG. 7(a) shows a typical pattern (reticle feature) used to define these pillar features, the pattern comprising a simple circle. However, this is a simplified diagram; more practically, it may be that the reticle pattern comprises one or more optical proximity correction (OPC) assist features. However, where this is the case, it should be appreciated that such OPC features are presently included for the purpose of forming a circle feature on the substrate as symmetrically as possible (regardless of focus).

FIGS. 7(b)-7(f) show a number of possible modifications of the pattern of FIG. 7(a) (modified reticle features) which introduce the desired focus dependent asymmetry in the structures (modified substrate structures) formed therefrom in, for example, a layer of photoresist, after development. These modified substrate structures can be measured with a scatterometer (or other metrology device) to create an asymmetry signal proportional to focus, in a manner similar to DBF/μDBF.

Figure 7B:
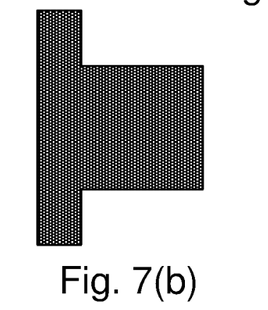
Figure 7C:
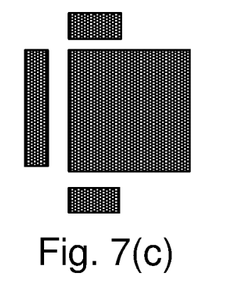
Figure 7D:
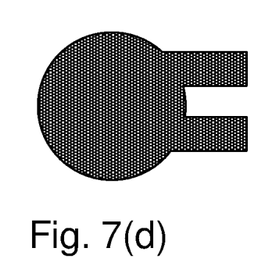
Figure 7E:
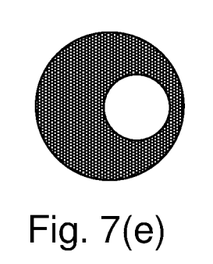
Figure 7F:
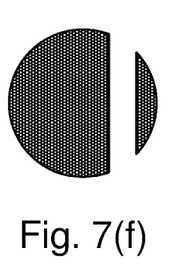
Figure 7G:
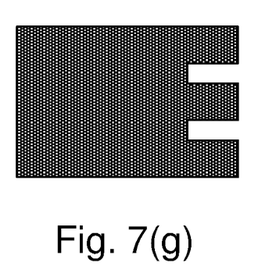

FIGS. 7(b) and 7(c) show an OPC (assist feature) embodiment which could be applied. The basic idea is that the exposed shape (geometry or profile) of the pillar feature should have a different size (e.g., radius) over a first portion of the pillar cross section as viewed from above (e.g., approximately a first half) compared to that of a second portion of the pillar cross section (e.g., approximately the second half). The resulting pillar will have a shape which is substantially oval (egg shaped) with an asymmetry which is focus dependent. FIGS. 7(b) and 7(c) show possible alternative reticle features for producing such a pillar, or though it will be appreciated that these are purely examples and other feature shapes which achieve largely the same effect are possible.

FIGS. 7(d)-7(g) show further possible reticle features which may also achieve the desired focus dependent asymmetry, while still etching approximately circular pillars suitable for support of the structure.

In an embodiment, the pattern for at least some of the supporting pillars on the reticle can be substituted by an arrangement of focus targets (e.g., properly segmented according to the design rules, so that each segment is similar enough to the pattern of a support pillar). Subsequent to their formation and measurement, a deep etching step is performed during which the focus target is etched through the multilayer structure and filled, in a manner similar to that of the supporting pillars. In this way, the focus targets act as supporting pillars and become part of the structure following the deep etching.

One or more patterns (modified reticle features) according to the patterns of FIGS. 7(b) to (g) may be provided on a patterning devices that may be used in a lithographic apparatus to print or form one or more modified substrate features on a substrate, e.g., in a photoresist layer. In the context of this invention, the term "reticle", "mask" have the same meaning as the term patterning device.

Figure 8:
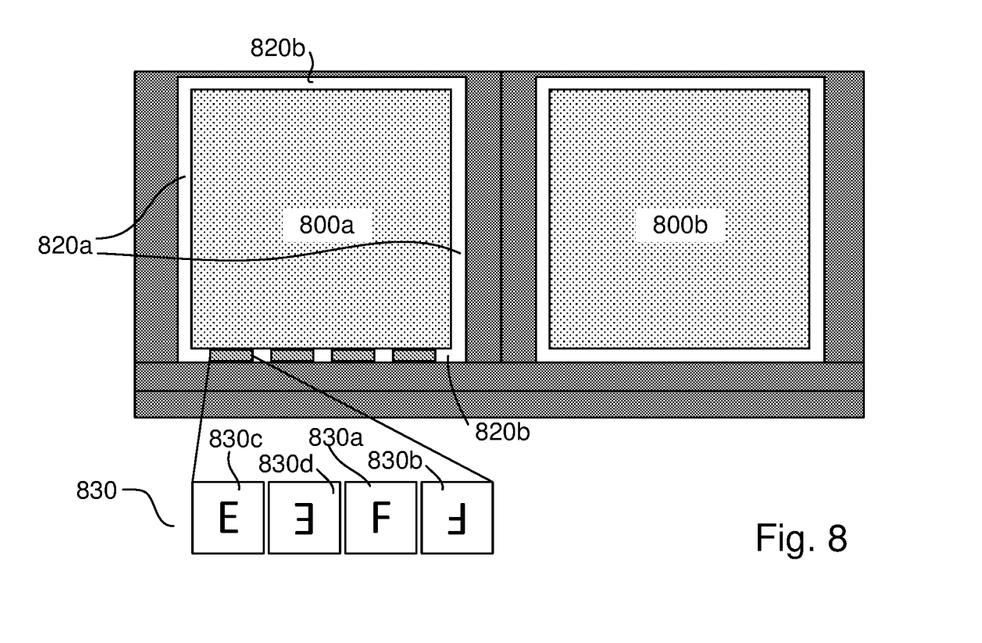
FIG. 8 is a schematic illustration of the vertically integrated memory device of FIG. 6, illustrating a further embodiment of the invention.

In an optional embodiment it is proposed that focus targets be incorporated on the staircase structures of the cell array. FIG. 8 illustrates such an example, and comprises a top-down view of the vertically integrated structures at the top of FIG. 6. The staircase structures are well known features of vertically integrated circuits, enabling connection to each layer in the stack. The staircase structures 820a on only two sides of each cell array 800a, 800b are actually used for the electrical connections. Despite this, due to the fabrication process, staircase structures 820b are also formed on the other two sides, each having equivalent dimensions and profile as the staircase structures 820a, but which are not used for electrical connections. It is proposed to place focus dependent targets on these unused staircase structures 820b.

A typical μDBF target may comprise four segments, each forming a quadrant of the full target. The four segments may comprise two focus-sensitive segments (one segment per direction) and two corresponding dose-sensitive segments.

Dose values inferred from the dose-sensitive segments can be used to calibrate the focus measurements from the focus-sensitive segments. Such targets are described, for example, in WO2013/189724, which is hereby incorporated by reference. However, due to the dimensions of the staircase structures (which may be only 5 µm in the narrower dimension), such targets cannot be accommodated thereon. Therefore, for this embodiment, a modified focus (µDBF) target 830 is proposed, which can be integrated on the unused (sacrificial) staircase area 820b of a cell array. The modified µDBF target 830 comprises two focus-sensitive segments 830a, 830b (one per direction) and two dose-sensitive segments 830c, 830d (one per direction), all arranged in a single line (row); i.e., in a 1D array. Such a target therefore can be made to be 10 µm or smaller, or even 5 µm or smaller, in its narrowest dimension. A number of these targets 830 can be accommodated in one or both of the unused staircase areas 820b.

The method above is described solely in terms of determining the focus setting (actual focus) of the lithography apparatus used. However, it will be appreciated that the method may also be used to determine one or more other characteristic relating to one or more structures on a substrate, for example the dose setting (actual dose) used.

The method described above describes modification of features formed to have no electrical function, more specifically support features. However, the concepts herein are also applicable to features which do have some electrical function, such as large contact pads or interconnects. As such, modification of such features for a secondary metrology purpose is also within the scope of this disclosure.

This proposal described herein provides accurate focus measurement directly on the device area, thus improving any other measurement method that uses targets in other field locations. This means that the target patterns can be included on product reticle and printed on product substrates as part of an actual manufacturing process. In this way, focus from actual product substrates can be measured, from printed structures formed by the same illumination and during the same exposure as the product structures. This proposal also provides a measurement method which is faster than present methods for measuring focus on the device area, since such methods require CDSEM and rework of the wafer.

Further embodiments are disclosed in the subsequent numbered clauses:

1. A method of determining a characteristic of interest relating to a structure on a substrate formed by a lithographic process, the method comprising:

measuring a modified substrate feature to determine said characteristic of interest, wherein the modified substrate feature being formed on the substrate using a corresponding modified reticle feature on a patterning device, said modified substrate feature being formed for a primary function other than metrology, the modified reticle feature being such that said modified substrate feature is formed with a geometry dependent on the characteristic of interest during formation.

2. The method according to clause 1 further comprising the stage of forming the modified substrate feature on the substrate using the corresponding modified reticle feature on the patterning device.

3. The method as defined in clause 1 or 2, wherein the modified substrate feature has no electrical function.

4. The method as defined in any one of the preceding clauses, wherein the characteristic of interest is focus of a lithographic apparatus during formation of said modified substrate feature.

5. The method as defined in clause 4, wherein the geometry dependent on the characteristic of interest comprises a focus dependent asymmetry which can be measured in the measuring step.

6. A method as defined in clause 4 or 5, wherein the lithographic process is related to the formation of a vertically integrated structure and the modified substrate feature has a primary function related to support of the vertically integrated structure.

7. A method as defined in clause 6, wherein the modified substrate feature comprises a support feature for forming a support structure for the vertically integrated structure.

8. A method as defined in clause 7, wherein said support feature comprises a hole feature.

9. A method as defined in clause 7 or 8, comprising, subsequent to said forming and measuring steps, filling said support feature when aligned with corresponding support features in other layers so as to form said support structure.

10. A method as defined in any of clauses 6 to 9, wherein the vertically integrated structure comprises a staircase structure at its periphery and said modified substrate feature is formed on an area of the substrate corresponding with said staircase structure.

11. A method as defined in clause 10, wherein the modified substrate feature is formed on an area of the substrate area corresponding with said staircase structure on a side of vertically integrated structure where no electrical connections are to be made to the staircase structure.

12. A method as defined in any of clauses 3 to 11, wherein the modified reticle features are such that the a dimension of a first portion of the corresponding modified substrate feature differs from a dimension of a second portion of the corresponding modified substrate feature in a focus dependent manner.

13. A method as defined in any of clauses 3 to 12, wherein the modified reticle features are such that they induce a focus dependent oval geometry in the corresponding modified substrate feature.

14. A method as defined in any preceding clause, wherein the modified reticle features have been designed using optical proximity correction techniques.

15. A method as defined in any preceding clause, wherein the measuring step is performed using a scatterometer.

16. A method as defined in any preceding clause, wherein the measuring step comprises measuring asymmetry in the modified substrate feature; and determining said characteristic of interest from the modified substrate feature.

17. A method as defined in any preceding clause, wherein the step of forming a modified substrate feature is performed simultaneously with the formation of a contact hole layer.

18. A method as defined in any preceding clause, wherein the modified substrate feature is formed on a device area of the substrate comprising product structures.

19. A method as defined in any preceding clause, wherein the characteristic of interest comprises dose of a lithographic apparatus during formation of said modified substrate feature.

20. A patterning device comprising a modified reticle feature for forming a modified substrate feature on a substrate with a geometry dependent on the characteristic of interest during its formation, and wherein said modified substrate feature has a primary function other than metrology.

21. A patterning device as defined in clause 20, wherein said modified substrate feature has no electrical function.

22. A patterning device as defined in clause 20 or 21, wherein the characteristic of interest is focus during formation of said modified substrate feature.

23. A patterning device as defined in clause 22, wherein the geometry dependent on the characteristic of interest comprises a focus dependent asymmetry.

24. A patterning device as defined in clause 22 or 23, wherein the patterning device is for patterning a layer of a vertically integrated structure and the modified substrate feature has a primary function related to support of the vertically integrated structure.

25. A patterning device as defined in clause 24, wherein the modified substrate feature comprises a feature for forming a support structure for the vertically integrated structure.

26. A patterning device as defined in clause 25, wherein said support feature comprises a hole feature.

27. A patterning device as defined in clause 24, 25 or 26, wherein the vertically integrated structure comprises a staircase structure at its periphery and said modified reticle feature is located on an area of the patterning device corresponding with said staircase structure.

28. A patterning device as defined in clause 27, wherein the modified reticle feature is located on an area of the patterning device corresponding with said staircase structure on a side of the vertically integrated structure where no electrical connections are to be made to the staircase structure.

29. A patterning device as defined in any of clauses 22 to 28, wherein the modified reticle features are such that a dimension of a first portion of the corresponding modified substrate feature differs from a dimension of a second portion of the corresponding modified substrate feature in a focus dependent manner.

30. A patterning device as defined in any of clauses 22 to 29, wherein the modified reticle features are such that they induce a focus dependent oval geometry in the corresponding modified substrate feature.

31. A patterning device as defined in any of clauses 20 to 30, wherein modified reticle features have been designed using optical proximity correction techniques.

32. A patterning device as defined in any of clauses 20 to 31, wherein the measuring step is performed using a scatterometer.

33. A patterning device as defined in any of clauses 20 to 32, wherein the measuring step comprises measuring asymmetry in the modified substrate feature; and determining said characteristic of interest from the modified substrate feature.

34. A patterning device as defined in any of clauses 20 to 33, wherein the patterning device further comprises features for forming contact holes.

35. A patterning device as defined in any of clauses 20 to 34, wherein the modified reticle feature is located on a device area of the patterning device.

36. A lithographic system for determining a characteristic of interest relating to at least one structure on a substrate formed by a lithographic process, the lithographic system comprising:
a patterning device as defined in any of clauses 20 to 35, for forming a subsequent modified substrate feature on a substrate; and
a metrology device for performing the measurement step of any of clauses 1 to 19.

37. A non-transitory computer program product comprising machine-readable instructions for causing a processor to cause performance of the method of any of clauses 1 to 19.

38. A method of determining a focus setting relating to formation of a structure on a substrate by a lithographic process in the manufacture of a vertically integrated structure, the method comprising:
forming a substrate support feature, for providing a support structure for the vertically integrated structure, on the substrate using a corresponding reticle support feature, said reticle support feature being such that said substrate support feature is formed with a geometry dependent on the characteristic of interest during formation; and
measuring said substrate support feature to determine said focus setting.

39. A patterning device for patterning a layer of a vertically integrated structure, comprising: a reticle support feature for forming a substrate support feature on a substrate with a geometry dependent on a focus setting during its formation, and wherein said substrate support feature is for providing a support structure for the vertically integrated structure.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of an inspection or metrology apparatus, embodiments of the invention may be used in other apparatus. Embodiments of the invention may form part of a mask inspection apparatus, a lithographic apparatus, or any apparatus that measures or processes an object such as a wafer (or other substrate) or mask (or other patterning device). It is also to be noted that the term metrology apparatus or metrology system encompasses or may be substituted with the term inspection apparatus or inspection system. A metrology or inspection apparatus as disclosed herein may be used to detect defects on or within a substrate and/or defects of structures on a substrate. In such an embodiment, a characteristic of the structure on the substrate may relate to defects in the structure, the absence of a specific part of the structure, or the presence of an unwanted structure on the substrate, for example.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:
1. A patterning device comprising:
a modified reticle feature adapted to form, during a lithographic process, a modified substrate feature on a vertically integrated structure with a geometry dependent on a characteristic of interest during its formation, and wherein the modified substrate feature is configured to have a primary function related to support of the vertically integrated structure and a secondary function to introduce focus or dose-dependent asymmetry as the characteristic of interest.

2. A lithographic system for determining a characteristic of interest relating to a vertically integrated structure on a substrate formed by a lithographic process, the lithographic system comprising:

a patterning device comprising a modified reticle feature adapted to form, during a lithographic process, a modified substrate feature on the vertically integrated structure with a geometry dependent on the characteristic of interest during its formation, and wherein the modified substrate feature is configured to have a primary function related to support of the vertically integrated structure and a secondary function to introduce focus or dose-dependent asymmetry as the characteristic of interest; and a metrology device for measuring the modified substrate feature to determine the characteristic of interest.

3. A method of determining a characteristic of interest relating to a structure on a substrate formed by a lithographic process, the method comprising:

measuring a modified substrate feature to determine the characteristic of interest, wherein the modified substrate feature is formed on the substrate using a corresponding modified reticle feature on a patterning device, the modified substrate feature being formed for a primary function other than metrology, the modified reticle feature being such that the modified substrate feature is formed with a geometry dependent on the characteristic of interest during formation, wherein the lithographic process is related to the formation of a vertically integrated structure and the modified substrate feature has the primary function related to support of the vertically integrated structure and a secondary function to introduce focus or dose-dependent asymmetry as the characteristic of interest; and determining the characteristic of interest.

4. The method of claim 3, further comprising forming the modified substrate feature on the substrate using the corresponding modified reticle feature on the patterning device.

5. The method of claim 3, wherein the modified substrate feature has no electrical function.

6. The method of claim 3, wherein the characteristic of interest is focus of a lithographic apparatus during formation of the modified substrate feature and wherein the geometry dependent on the characteristic of interest comprises a focus dependent asymmetry that can be measured in the measuring step.

7. The method of claim 3, wherein the support feature comprises a hole feature.

8. The method of claim 3, wherein the vertically integrated structure comprises a staircase structure at its periphery and the modified substrate feature is formed on an area of the substrate corresponding with the staircase structure and wherein the modified substrate feature is formed on an area of the substrate area corresponding with the staircase structure on a side of the vertically integrated structure where no electrical connections are to be made to the staircase structure.

9. The method of claim 8, wherein the modified substrate feature is formed on an area of the substrate area corresponding with the staircase structure on a side of the vertically integrated structure where no electrical connections are to be made to the staircase structure.

10. The method of claim 3, wherein the modified reticle features are such that a dimension of a first portion of the corresponding modified substrate feature differs from a dimension of a second portion of the corresponding modified substrate feature in a focus dependent manner.

11. The method of claim 3, wherein the modified reticle features are such that they induce a focus dependent oval geometry in the corresponding modified substrate feature.

12. The method of claim 3, wherein the step of forming a modified substrate feature is performed simultaneously with the formation of a contact hole layer.

13. A non-transitory computer program product comprising machine-readable instructions for causing a processor to cause performance of the method of claim 3.

14. The non-transitory computer program product of claim 13, wherein the modified substrate feature on the substrate is formed using the corresponding modified reticle feature on the patterning device.

15. The non-transitory computer program product of claim 13, wherein the modified substrate feature is formed so as to have no electrical function.

16. The non-transitory computer program product of claim 13, wherein the characteristic of interest is focus of a lithographic apparatus during formation of the modified substrate feature and wherein the geometry dependent on the characteristic of interest comprises a focus dependent asymmetry that can be measured in the measuring step.

17. The non-transitory computer program product of claim 13, wherein the vertically integrated structure comprises a staircase structure at its periphery and the modified substrate feature is formed on an area of the substrate corresponding with the staircase structure and wherein the modified substrate feature is formed on an area of the substrate area corresponding with the staircase structure on a side of the vertically integrated structure where no electrical connections are to be made to the staircase structure.

18. The non-transitory computer program product of claim 17, wherein the modified substrate feature is formed on an area of the substrate area corresponding with the staircase structure on a side of the vertically integrated structure where no electrical connections are to be made to the staircase structure.

19. The non-transitory computer program product of claim 13, wherein the modified reticle features are such that a dimension of a first portion of the corresponding modified substrate feature differs from a dimension of a second portion of the corresponding modified substrate feature in a focus dependent manner.

20. The non-transitory computer program product of claim 13, wherein the modified reticle features are such that they induce a focus dependent oval geometry in the corresponding modified substrate feature.

* * * * *

UNITED STATES PATENT AND TRADEMARK OFFICE
CERTIFICATE OF CORRECTION

PATENT NO. : 11,385,554 B2
APPLICATION NO. : 16/456878
DATED : July 12, 2022
INVENTOR(S) : Garcia Granda et al.

It is certified that error appears in the above-identified patent and that said Letters Patent is hereby corrected as shown below:

In the Specification

In Column 1, Line 60, delete "K1." and insert -- $K_1$. --, therefor.

In Column 3, Line 55, after "invention;" insert -- and --.

In Column 6, Line 66, delete "scatterometter" and insert -- scatterometer --, therefor.

In Column 7, Line 30, delete "k)" and insert -- $\lambda$) --, therefor.

In Column 8, Line 18, delete "zeroeth" and insert -- zeroth --, therefor.

In Column 8, Line 34, delete "3(b)" and insert -- 5(b) --, therefor.

In Column 8, Line 53, delete "zeroeth" and insert -- zeroth --, therefor.

In Column 8, Line 66, delete "zeroeth" and insert -- zeroth --, therefor.

In Column 9, Line 26, delete "3(c) and (d)." and insert -- 5(c) and 5(d). --, therefor.

In Column 9, Line 56, delete "scatterometery" and insert -- scatterometry --, therefor.

In Column 12, Line 43, delete "(g)" and insert -- 7(g) --, therefor.

In Column 14, Line 31, delete "the a" and insert -- a --, therefor.

Signed and Sealed this
Twenty-fifth Day of June, 2024

Katherine Kelly Vidal
*Director of the United States Patent and Trademark Office*